US 6,601,777 B2
Sun et al.
(45) Date of Patent: Aug. 5, 2003

(12) United States Patent
(10) Patent No.: US 6,601,777 B2

(54) SUSPENDED PARTICLE CONTAINER FOR AN ATOMIZER

(75) Inventors: James J. Sun, New Brighton, MN (US); Benjamin Y. H. Liu, North Oaks, MN (US); Michael J. Rosen, Burnsville, MN (US)

(73) Assignee: MSP Corporation, Shoreview, MN (US)

( * ) Notice: Subject to any disclaimer, the term of this patent is extended or adjusted under 35 U.S.C. 154(b) by 92 days.

(21) Appl. No.: 09/772,707

(22) Filed: Jan. 30, 2001

(65) Prior Publication Data

US 2002/0103657 A1 Aug. 1, 2002

(51) Int. Cl.[7] .................................................. B05B 1/08
(52) U.S. Cl. .................................. 239/102.1; 239/102.2
(58) Field of Search ........................... 239/102.2, 102.1, 239/144, 142, 346, 342; 366/127, 108

(56) References Cited

U.S. PATENT DOCUMENTS

| | | | | |
|---|---|---|---|---|
| 3,561,444 A | * | 2/1971 | Boucher | 128/200.16 |
| 4,113,809 A | * | 9/1978 | Abair et al. | 128/200.16 |
| 4,976,259 A | * | 12/1990 | Higson et al. | 128/200.16 |
| 6,402,046 B1 | * | 6/2002 | Loser | 128/200.16 |

* cited by examiner

Primary Examiner—Lisa A. Douglas
(74) Attorney, Agent, or Firm—Westman, Champlin & Kelly, P.A.

(57) ABSTRACT

A container for containing a liquid that has suspended particles used for depositing on a substrate is formed of an electrically conductive material, and has a bottom wall. An atomizer for atomizing the liquid and particles to form an aerosol is mounted at an upper end thereof. A bottom wall of the container has a piezoelectric ultrasonic transducer attached to the wall. A high voltage connection to the piezoelectric transducer is in a recess formed by a lower skirt on the container and is mounted in an insulating block in the recess. A cup shaped insulating sleeve slips over the lower portions of the container and shields the high voltage connection from the exterior.

9 Claims, 3 Drawing Sheets

SUSPENDED PARTICLE CONTAINER FOR AN ATOMIZER

BACKGROUND OF THE INVENTION

The present invention relates to an atomizer container for liquid having a suspension of particles to be deposited on a wafer in a deposition chamber. The container and liquid is vibrated ultrasonically with a high voltage drive vibrating transducer to keep the particles in the deposition chamber in suspension. The high voltage drive is shielded to avoid contact with an operator.

Ultrasonic vibration has been used in aerosol generators for agitating the liquid to maintain a suspension of particles.

High voltages are generally needed for the operation of ultrasonic vibration generators, which usually are piezoelectric ceramics or crystals. Contact by an operator with the conductors is to be avoided. The present container is assembled in a manner that maintains a high level of isolation for the high voltage components from the exterior, so that the likelihood of contact by an operator is greatly reduced.

SUMMARY OF THE INVENTION

An atomizer container for a liquid that carries a suspension of particles used for deposition on wafers in a deposition chamber is assembled with a piezoelectric ultrasonic transducer on a bottom wall of the container to provide ultrasonic vibrations in the liquid. The particles remain in suspension when the container is ultrasonically vibrated so an aerosol containing the desired particles can be maintained. A high voltage contact assembly is used for connecting the piezoelectric ultrasonic vibration transducer to the voltage source. The connections to the transducer are carried through an insulated housing that reduces the likelihood of an operator contacting any of the components.

The particle suspension is maintained by the vibrational energy, so when the liquid is passed through the atomizer nozzle in order to form an aerosol for deposition of the particles in a deposition chamber. When several different particles are to be deposited in one chamber, a number of liquid containers are provided, each with a different particle suspension or characteristic, and sequential use means that one container may be inactive, with no aerosol generated from the liquid, for a long period of time.

The coupling of the high voltage power to the transducer is surrounded by a well insulated cup or sleeve that connects to the base of the container. The cup or sleeve carries an electrical connector that couples to the ultrasonic piezoelectric transducer. The piezoelectric transducer is in intimate contact with the bottom wall of the container. The likelihood that conductors on one container would be contacted by an operator are thus decreased.

DETAILED DESCRIPTION OF THE PREFERRED EMBODIMENTS

Figure 1:
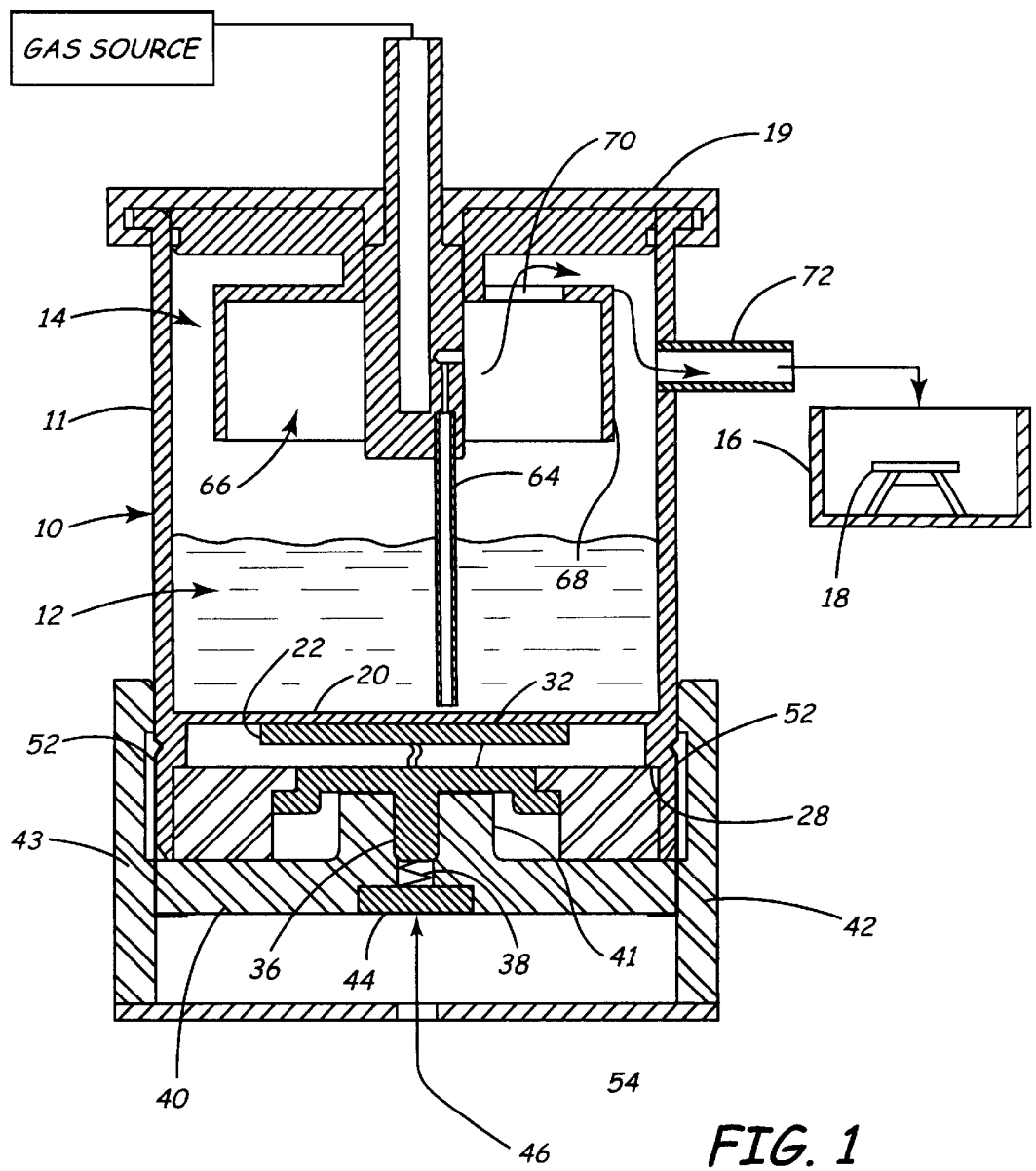
FIG. 1 is a vertical sectional view through a container for aerosol particles suspended in a liquid having a vibrating transducer with an electrical connection according to the present invention.
Figure 2:
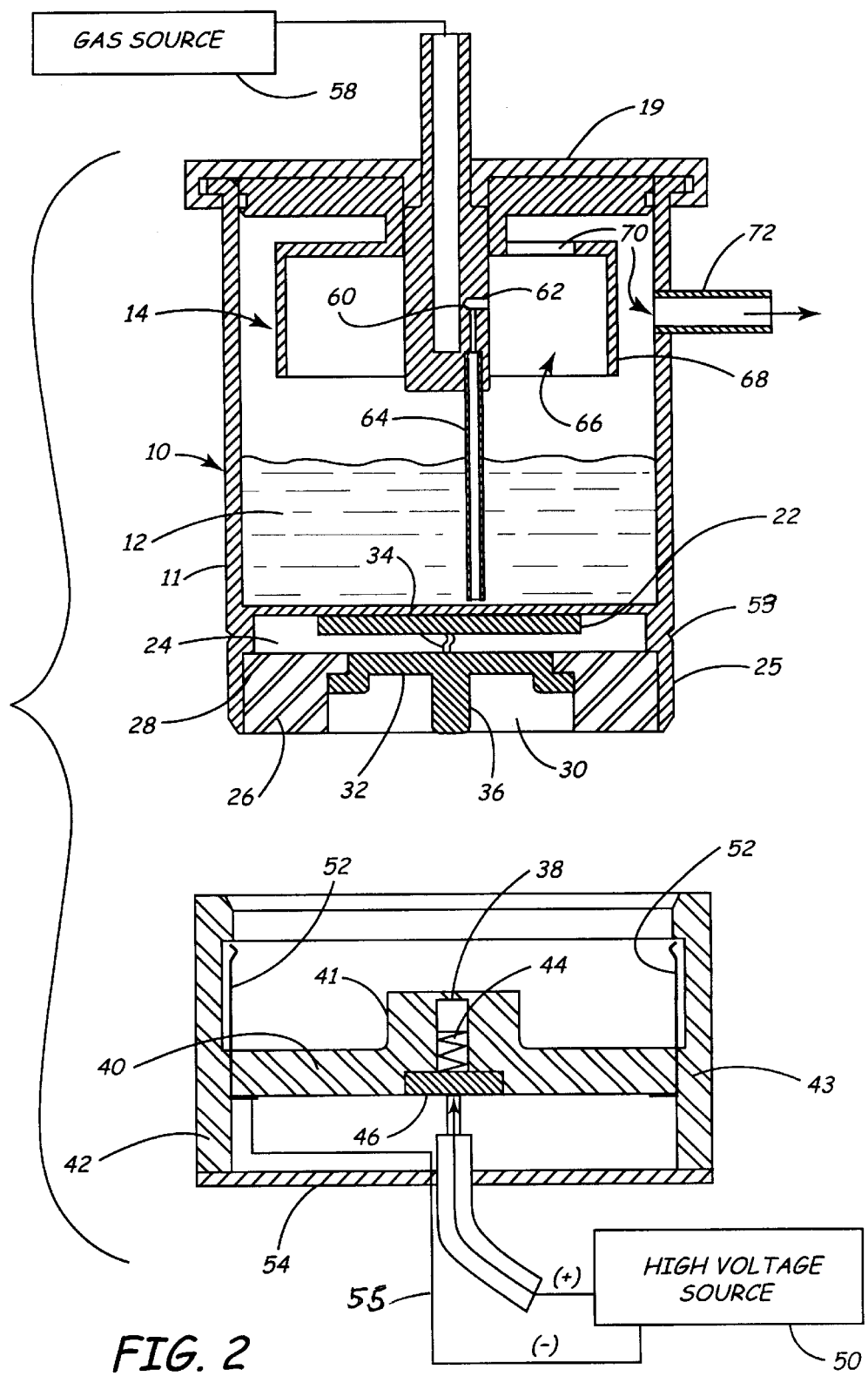
FIG. 2 is an exploded view of FIG. 1 showing the connecting parts separated.
Figure 3:
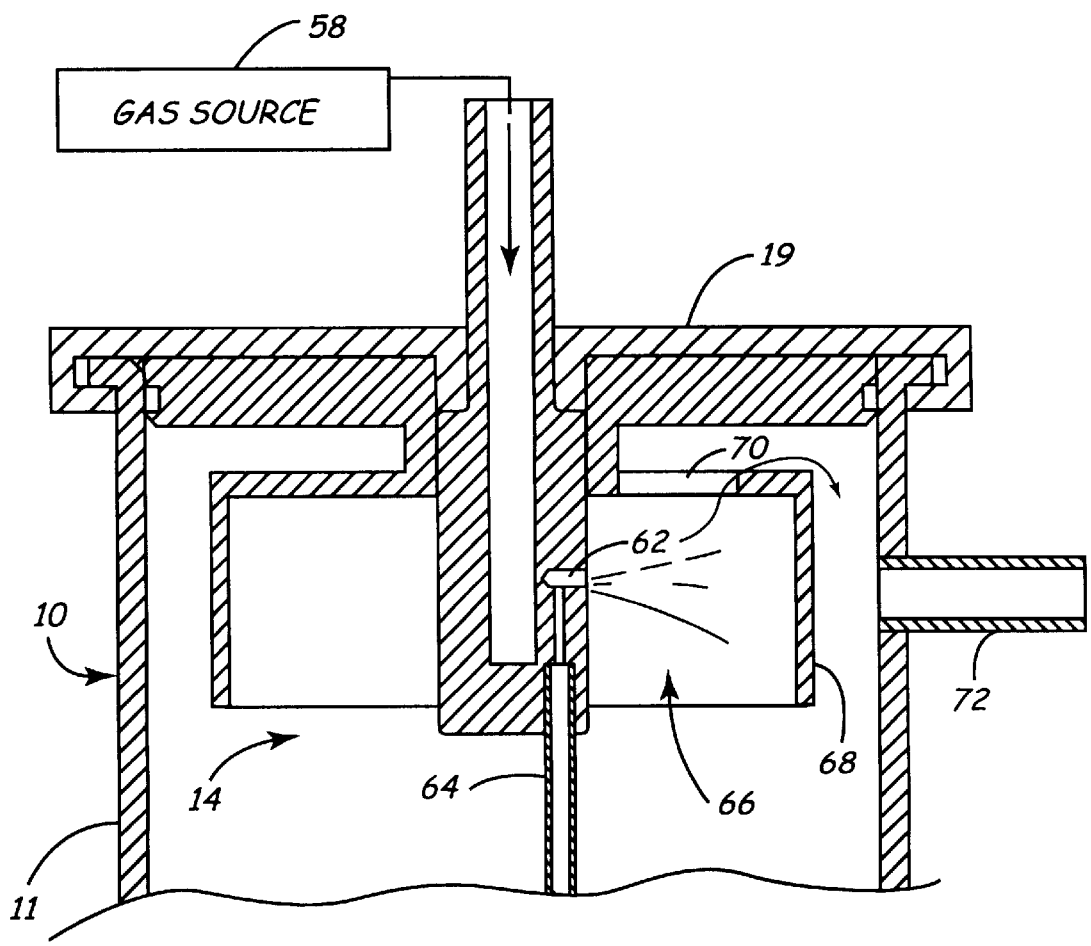
FIG. 3 is an enlarged view of the atomizer section shown in the container, as an example of the type of atomizer used with the container.

Referring to FIG. 1, a container 10 is used for containing a liquid 12 with particles in suspension in the liquid. The container has an outer cylindrical side wall 11 defining an interior chamber that is closed with a cover 19. The liquid 12 is in the interior of the container 10. The liquid 12 may be water, containing particles such as polystyrene latex (PSL) particles, or particles of copper, tungsten, or other materials that are used in deposition systems for deposition of the particles onto semiconductor wafers or other substrates. The particles are suspended in the liquid. An atomizer section 14 is used for aspirating the liquid, containing the particles, and forming an aerosol that is discharged and provided to a deposition chamber 16 wherein the particles are deposited onto a substrate, indicated at 18.

In order to maintain the particles in suspension in the liquid 12, a bottom wall 20 of the container 10 has an ultrasonic piezoelectric vibrating transducer 22 intimately bonded to the exterior surface of the wall. As shown, the transducer 22 is in a cavity 24 formed by a skirt 25 that is an extension of the wall 11 at the bottom of the container. An insulating block 26 is held in the cavity 24 against a shoulder 28 formed in the cavity 24. The insulating block 26 has a central recess or opening 30 in which a metal electrical contact 32 is held. The contact 32 is the connection for applying a voltage and is connected with suitable lines 34 to the piezoelectric transducer 22. The contact 32 has a projection or prong 36 that is received in a recess or bore 38 of a sleeve 41 on an insulating block 40 held in an outer insulating sleeve or cup 42. The projection 36 bears against a metal voltage carrying spring 44 that in turn is connected to a contact 46 that is securely soldered to a lead 48 leading to a high voltage source 50.

The cup 42 has an annular sleeve or wall 43 that receives the skirt 25 of the container. Spring loaded fingers 52 are carried by the cup 42 and have bent ends that are received in a retainer groove 53 on the outer surface of the skirt 25 of the container when the parts are assembled. The cup 42 is held in place by the spring loaded fingers 52 and the fingers also form a ground connection to the stainless steel container 10. The cup 42 is a rigid insulating material and the wall 43 surrounds the lower skirt portion of the container 10 and shields the high voltage contacts leading to the piezoelectric transducer 22. The cup 42 is closed with a bottom wall 54, that has an opening through which the high voltage line 48 and ground line 55 pass.

The atomizer 14, as shown, receives a gas from a pressurized gas source 58, the gas flows through a control orifice 60 into an atomizing bore or outlet 62. Liquid 12 containing the particles is aspirated through a tube 64 and formed into an aerosol that discharges into an annular impaction chamber 66 formed by an annular wall 68. Large particles will be impacted and will drop down into the liquid 12, but the aerosol carrying small particles will be discharged out through an opening 70 in the impaction chamber and carried out through an outlet tube 72 to the deposition chamber 16. The aerosol is introduced into the chamber 16 and the particles that are carried in the aerosol and which had been suspended in the liquid 12, will be deposited onto the substrate 18.

The insulating cup 42 carries contacts for carrying the high voltage to the ultrasonic transducer and the container, through the projection or prong 36, the spring 44, and contact 46. The outer wall or sleeve member 43 of the cup 42 shields the contacts and connections and use of the insulating cup avoids the possibility of a person contacting both the ground and positive terminals of the high voltage connectors. The container 10 is grounded, and touching that container will not provide any substantial electrical transmission. The high voltage terminals are shielded fully.

Again, the cup member 42 has a sleeve or wall 43 that forms an insulating shield or guard. The wall 43 extends around all of the high voltage contacts leading to the piezoelectric transducer section.

The transducer can be designed to vibrate at the desired frequency. The voltage source also can have a control to control voltage applied to the transducer.

Although the present invention has been described with reference to preferred embodiments, workers skilled in the art will recognize that changes may be made in form and detail without departing from the spirit and scope of the invention.

What is claimed is:

1. A container for a suspension of particles in a liquid for use in forming an aerosol, the container having a side wall and a bottom wall, an atomizer in upper portions of the container, the liquid and suspended particles being contained in a lower portion of the container, and a piezoelectric transducer mounted on the bottom wall of a container to provide vibrations to the liquid in the container, a high voltage connection to the piezoelectric transducer, and high voltage connection comprising a contact connected to the piezoelectric transducer and extending outwardly therefrom, the container having a skirt wall surrounding the contact, the contract being insulated from the container, and a sleeve of insulating material removably slidably mounted on the container skirt and surrounding the high voltage connection contact to shield the high voltage connection contact from engagement by an operator, and a cross wall of insulating material to close the opening formed by the sleeve, the cross wall being in registry with the bottom wall of the container, and having an electrical connector positioned to engage the contact when the sleeve is mounted on the container.

2. The container of claim 1, wherein said contact connected to the piezoelectric transducer comprises a prong extending outwardly from the bottom wall of the container, said electrical connector on the cross wall comprising a receptacle open toward the bottom wall of the container of size to receive the prong, a second contact on an opposite side of the cross wall from the receptacle, a spring mounted in the receptacle and connected to said second contact and engaging the prong when the sleeve is mounted on the container.

3. A container for a suspension of particles in a liquid for use in forming an aerosol, the container having a side wall and a bottom wall, an atomizer in upper portions of the container, the liquid and suspended particles being container in a lower portion of the container, and a piezoelectric transducer mounted on the bottom wall of the container to provide vibrations to the liquid in the container a high voltage connection to the piezoelectric transducer, and a sleeve of insulating material mounted on the container and surrounding the high voltage connection to shield the high voltage connection from engagement by an operator, wherein the container is made of electrically conductive material, and forms a ground contact for the piezoelectric transducer.

4. The container of claim 3 and a metal clip supported on the sleeve and engaging the container when the sleeve is mounted on the container, the clip being coupled to a ground of the high voltage source.

5. A container for a liquid suspension used in a deposition system, said liquid suspension including particles to be deposited on a substrate, the container comprising a side wall surrounding an interior chamber, and a bottom wall closing the interior chamber, a piezoelectric transducer attached to the bottom wall on an exterior surface thereof, said container having a skirt forming a recess open to the bottom wall and receiving the transducer, an insulating support in said recess, a contact member held by the insulating support and being electrically connected to the piezoelectric transducer, the contact member including a portion on a side of the support opposite from the container, and a sleeve removably mounted on said container, said sleeve being of insulating material that extends upwardly along the sides of the container skirt to shield the contact in the recess of the container from the exterior, and the sleeve having an electrical connector thereon which engages the contact when the sleeve is mounted on the container.

6. The container of claim 5, wherein said sleeve has a cross wall to form a cup shaped assembly, said cross wall covering the recess at the bottom of the container.

7. The container of claim 6, wherein said cross wall has an electrically conductive pad forming a second contact, a spring engaging the second contact and positioned in the receptacle, the contact having a projection that fits into the receptacle in the cross wall and electrically engages the spring.

8. The container of claim 7, wherein said sleeve has a second wall spaced from the cross wall, and forming an outer end wall of the sleeve.

9. The container of claim 5, and spring loaded electrically conductive finger members carried on said sleeve for releasably holding the sleeve on the container and making electrical contact with the container.

\* \* \* \* \*

UNITED STATES PATENT AND TRADEMARK OFFICE
CERTIFICATE OF CORRECTION

PATENT NO.      : 6,601,777 B2
DATED           : August 5, 2003
INVENTOR(S)     : Sun et al.

It is certified that error appears in the above-identified patent and that said Letters Patent is hereby corrected as shown below:

Column 3,
Line 19, change "a" to -- the --.
Line 21, change "and" to -- said --.
Line 25, change "contract" to -- contact --.
Line 34, change "said" to -- the --.
Line 47, change "container" to -- contained --.

Column 4,
Line 2, insert -- , -- after "container".

Signed and Sealed this

Twenty-first Day of October, 2003

JAMES E. ROGAN
*Director of the United States Patent and Trademark Office*